United States Patent
Shwe et al.

(10) Patent No.: US 10,962,571 B2
(45) Date of Patent: Mar. 30, 2021

(54) INTERPOSERS HAVING CUTS THROUGH AN INSULATING SUBSTRATE

(71) Applicant: TEXAS INSTRUMENTS INCORPORATED, Dallas, TX (US)

(72) Inventors: Thiha Shwe, Murphy, TX (US); Hisashi Ata, Murphy, TX (US); James L. Oborny, Bells, TX (US); John Allen Hite, Forney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 348 days.

(21) Appl. No.: 15/873,790

(22) Filed: Jan. 17, 2018

(65) Prior Publication Data
US 2019/0204359 A1    Jul. 4, 2019

Related U.S. Application Data

(60) Provisional application No. 62/612,407, filed on Dec. 30, 2017.

(51) Int. Cl.
| | |
|---|---|
| *G01R 1/067* | (2006.01) |
| *G01R 1/073* | (2006.01) |
| *G01R 31/28* | (2006.01) |
| *H01L 21/48* | (2006.01) |
| *H01L 23/32* | (2006.01) |

(52) U.S. Cl.
CPC ..... *G01R 1/07378* (2013.01); *G01R 1/06755* (2013.01); *H01L 21/4846* (2013.01); *H01L 23/32* (2013.01)

(58) Field of Classification Search
CPC .......... G01R 1/06; G01R 1/067; G01R 1/073; G01R 31/28; H01L 23/32; H01L 23/48; H01L 23/49; H01L 23/498; H01L 23/62; H01L 21/48; H01L 21/66
See application file for complete search history.

(56) References Cited

U.S. PATENT DOCUMENTS

| | | | | |
|---|---|---|---|---|
| 7,060,528 | B2 * | 6/2006 | Nishikawa | H01L 24/11 257/E21.508 |
| 7,808,258 | B2 * | 10/2010 | Mangrum | G01R 31/2889 324/754.18 |
| 2003/0134450 | A1 * | 7/2003 | Lee | H01L 25/50 438/106 |
| 2013/0154678 | A1 * | 6/2013 | Nelson | G01R 1/06738 324/750.24 |
| 2018/0166355 | A1 * | 6/2018 | Suzuki | B24B 19/02 |

* cited by examiner

*Primary Examiner* — Neel D Shah
(74) *Attorney, Agent, or Firm* — Ronald O. Neerings; Charles A. Brill; Frank D. Cimino

(57) ABSTRACT

An interposer comprises an insulating substrate having a first side and a second side; a first plurality of metal contacts on the first side; a second plurality of metal contacts on the second side; and a plurality of cuts through the insulating substrate. The plurality of cuts comprise a first cut between a first metal contact in the first plurality of metal contacts and a second metal contact in the first plurality of metal contacts, and between a first metal contact in the second plurality of metal contacts and a second metal contact in the second plurality of metal contacts.

15 Claims, 4 Drawing Sheets

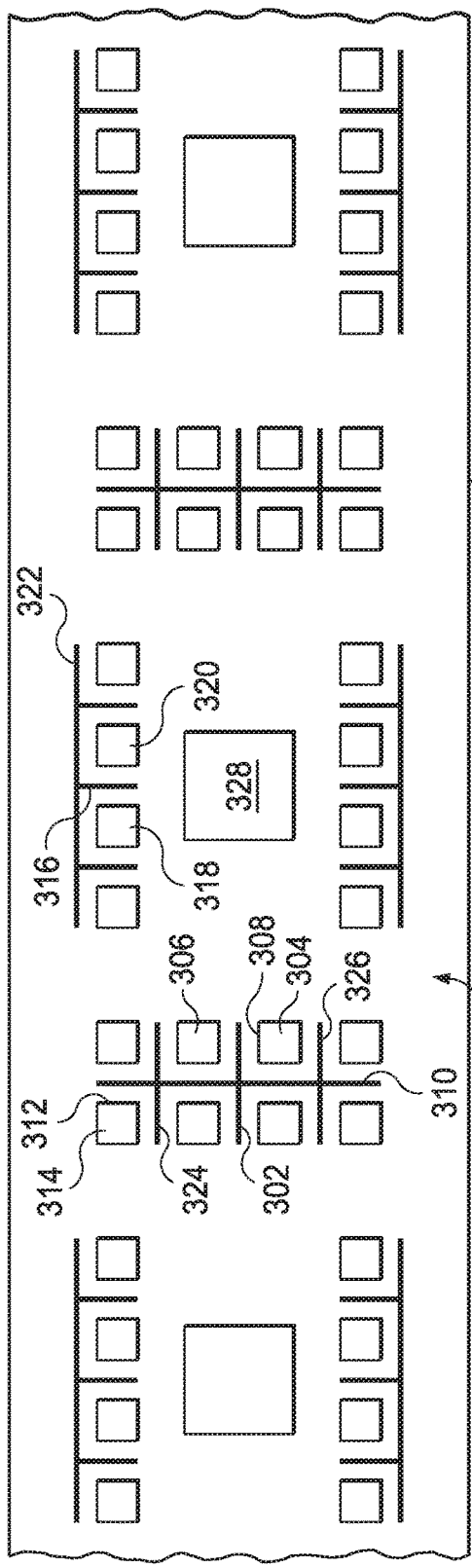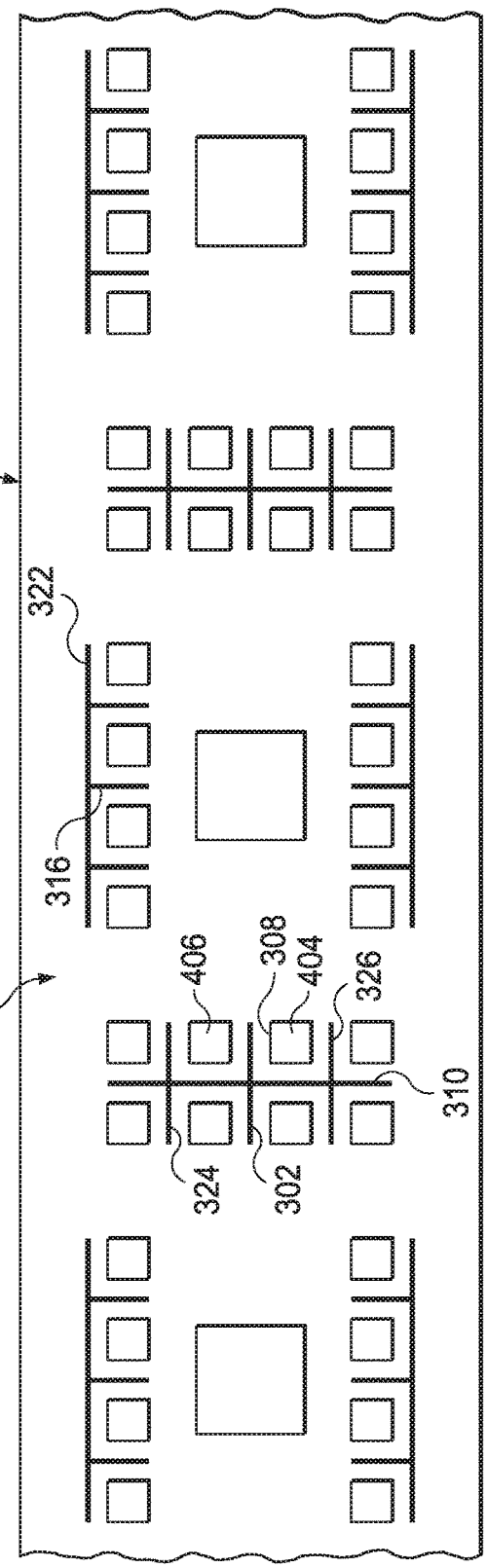

INTERPOSERS HAVING CUTS THROUGH AN INSULATING SUBSTRATE

CROSS-REFERENCE TO RELATED APPLICATIONS

The present application claims priority to U.S. Provisional Patent Application No. 62/612,407, which was filed Dec. 30, 2017, is titled "Interposers Having Cuts Through An Insulating Substrate," and is hereby incorporated herein by reference in its entirety.

BACKGROUND

In many systems for testing packaged integrated circuits, the integrated circuit is electrically coupled to test equipment by way of a contactor and a load-board. Contactor pins in the contactor electrically couple the integrated circuit to the load-board, and the test equipment is electrically coupled to the load-board.

SUMMARY

In accordance with at least one embodiment in the disclosure, an interposer comprises an insulating substrate having a first side and a second side; a first plurality of metal contacts on the first side; a second plurality of metal contacts on the second side; and a plurality of cuts through the insulating substrate. The plurality of cuts comprise a first cut between a first metal contact in the first plurality of metal contacts and a second metal contact in the first plurality of metal contacts, and between a first metal contact in the second plurality of metal contacts and a second metal contact in the second plurality of metal contacts.

In accordance with at least one embodiment in the disclosure, in the interposer, the plurality of cuts comprises a second cut perpendicular to the first cut.

In accordance with at least one embodiment in the disclosure, in the interposer, the first cut is contiguous with the second cut.

In accordance with at least one embodiment in the disclosure, in the interposer, the plurality of cuts comprises a third cut parallel to the first cut.

In accordance with at least one embodiment in the disclosure, in the interposer, the third cut is contiguous with the second cut.

In accordance with at least one embodiment in the disclosure, in the interposer, the third cut is between a third metal contact in the first plurality of metal contacts and a fourth metal contact in the first plurality of metal contacts, and between a third metal contact in the second plurality of metal contacts and a fourth metal contact in the second plurality of metal contacts.

In accordance with at least one embodiment in the disclosure, in the interposer, the third cut is between the second metal contact in the first plurality of metal contacts and a third metal contact in the first plurality of metal contacts, and between the second metal contact in the second plurality of metal contacts and a third metal contact in the second plurality of metal contacts.

In accordance with at least one embodiment in the disclosure, in the interposer, no two metal contacts in the first plurality of metal contacts are electrically connected to each other, and no two metal contacts in the second plurality of metal contacts are electrically connected to each other.

In accordance with at least one embodiment in the disclosure, in the interposer, the first plurality of metal contacts is in one-to-one correspondence with the second plurality of metal contacts.

In accordance with at least one embodiment in the disclosure, the interposer further comprises a plurality of vias in one-to-one correspondence with the first plurality of metal contacts, wherein each via in the plurality of vias electrically connects a corresponding metal contact in the first plurality of metal contacts with a corresponding metal contact in the second plurality of metal contacts.

In accordance with at least one embodiment in the disclosure, in the interposer, each metal contact in the second plurality of metal contacts has a smaller face than that of each metal contact in the first plurality of metal contacts.

In accordance with at least one embodiment in the disclosure, in the interposer, each metal contact in the second plurality of metal contacts is directly under a corresponding metal contact in the first plurality of metal contacts.

In accordance with at least one embodiment in the disclosure, in the interposer, the insulating substrate comprises an FR5 material.

In accordance with at least one embodiment in the disclosure, in the interposer, the insulating substrate comprises a glass epoxy composite.

In accordance with at least one embodiment in the disclosure, in the interposer, the insulating substrate comprises a plurality of layers, each layer comprising a glass epoxy composite.

In accordance with at least one embodiment in the disclosure, a method comprises placing, with a handler, a device-under-test (DUT) in electrical contact with an interposer. In the method, the interposer comprises an insulating substrate having a first side and a second side; a first plurality of metal contacts on the first side; a second plurality of metal contacts on the second side; and a plurality of cuts through the insulating substrate, the plurality of cuts comprising a first cut between a first metal contact in the first plurality of metal contacts and a second metal contact in the first plurality of metal contacts, and between a first metal contact in the second plurality of metal contacts and a second metal contact in the second plurality of metal contacts.

In accordance with at least one embodiment in the disclosure, in the method: the plurality of cuts comprises a second cut perpendicular to and contiguous with the first cut, and a third cut parallel to the first cut and contiguous with the second cut; and the third cut is between a third metal contact in the first plurality of metal contacts and a fourth metal contact in the first plurality of metal contacts, and between a third metal contact in the second plurality of metal contacts and a fourth metal contact in the second plurality of metal contacts.

In accordance with at least one embodiment in the disclosure, in the method: the plurality of cuts comprises a second cut perpendicular to and contiguous with the first cut, and a third cut parallel to the first cut and contiguous with the second cut; and the third cut is between the second metal contact in the first plurality of metal contacts and a third metal contact in the first plurality of metal contacts, and between the second metal contact in the second plurality of metal contacts and a third metal contact in the second plurality of metal contacts.

In accordance with at least one embodiment in the disclosure, a system comprises an interposer, where the interposer comprises: an insulating substrate having a first side and a second side; a first plurality of metal contacts on the first side; a second plurality of metal contacts on the second side; and a plurality of cuts through the insulating substrate. The plurality of cuts comprises: a first cut between a first metal contact in the first plurality of metal contacts and a second metal contact in the first plurality of metal contacts, between a first metal contact in the second plurality of metal contacts and a second metal contact in the second plurality of metal contacts, and parallel to a first side of the second metal contact; a second cut perpendicular to the first cut, contiguous with the first cut, and parallel to a second side of the second metal contact; and a third cut between the second metal contact in the first plurality of metal contacts and a third metal contact in the first plurality of metal contacts, between the second metal contact in the second plurality of metal contacts and a third metal contact in the second plurality of metal contacts, and parallel to the first cut.

In accordance with at least one embodiment in the disclosure, the system further comprises: a load-board having a plurality of metal contacts in contact with the second plurality of metal contacts; and a contactor having pins in contact with the first plurality of metal contacts, wherein for each metal contact in the first plurality of metal contacts, two or more pins in the contactor are in contact with each metal contact.

In accordance with at least one embodiment in the disclosure, an apparatus for testing packaged integrated circuits comprises: an interposer, comprising: an insulating substrate having a first side and a second side; a first plurality of metal contacts on the first side; a second plurality of metal contacts on the second side; and a plurality of cuts through the insulating substrate, the plurality of cuts comprising a first cut between a first metal contact in the first plurality of metal contacts and a second metal contact in the first plurality of metal contacts, and between a first metal contact in the second plurality of metal contacts and a second metal contact in the second plurality of metal contacts; a load-board having a plurality of metal contacts in contact with the second plurality of metal contacts; and a contactor having pins in contact with the first plurality of metal contacts, wherein for each metal contact in the first plurality of metal contacts, two or more pins in the contactor are in contact with the each metal contact.

In accordance with at least one embodiment in the disclosure, the apparatus for testing packaged integrated circuits further includes an automatic test equipment coupled to the load-board.

In accordance with at least one embodiment in the disclosure, a method of making an interposer, comprising: providing an insulating substrate having a first side and a second side; providing a first plurality of metal contacts on the first side; providing a second plurality of metal contacts on the second side, each of the second plurality of metal contacts being positioned directly under its corresponding metal contact on the first side; and weakening the substrate material such that each metal contact on the first side and its corresponding metal contact on the second side can have vertical movement relative to the bulk of the insulating substrate.

BRIEF DESCRIPTION OF THE DRAWINGS

For a detailed description of various examples, reference will now be made to the accompanying drawings in which:

FIG. 3 shows an illustrative interposer from a perspective looking down into the contactor side in accordance with various examples;

FIG. 4 shows an illustrative interposer from a perspective looking down into the load-board side in accordance with various examples;

DETAILED DESCRIPTION

In a test system, an integrated circuit (IC) under test is electrically coupled to a load-board by way of a contactor and interposer. Due to the fine pitch and large number of metal contacts (e.g., pads) in many types of packaged integrated circuits, it may be challenging for a test system to facilitate good electrical contact between an IC and an interposer (via contactor pins). In conventional test systems, load-board planarity is important to provide stable electrical contact between the load-board, the interposer, and the contactor pins that provide electrical connections to the IC. If sufficient planarity is not achieved, then some of the metal contacts in the IC package may not have a good electrical connection to the load-board. Prior systems have incorporated elastomers in the load-board, where pins in the load-boards have a relatively complicated structure incorporating elastomers. However, such load-boards can be expensive to manufacture, and the elastomer-type pins may not have sufficient current carrying capacity.

In accordance with the disclosed embodiments, an interposer used in a test system includes cuts to allow metal contacts on both sides of the interposer to flex in a vertical direction. This flexing helps facilitate good electrical contact of the interposer with the load-board, as well as to the contactor pins. Furthermore, by using an interposer in accordance with the disclosed embodiments, more than one contactor pin per metal contact may be used, thereby further facilitating good electrical contact by reducing contactor contact resistance ($C_{RES}$) by one-half. Using an interposer according to embodiments is also expected to decrease wear on the load-board, thereby increasing its useful service time.

Figure 1:
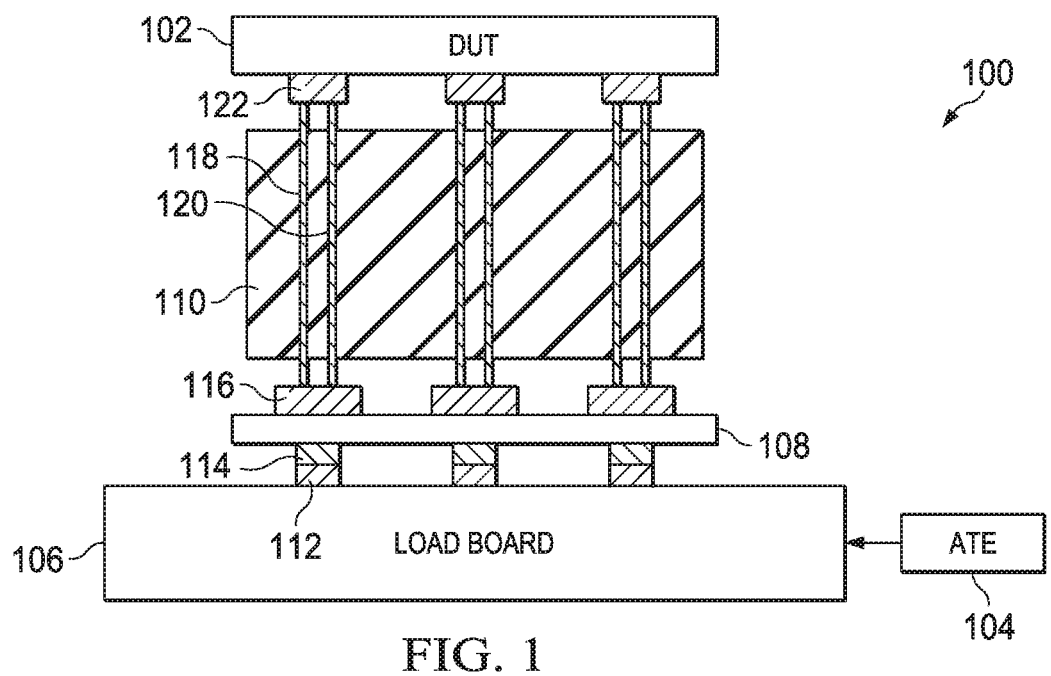
FIG. 1 shows an illustrative test system in accordance with various examples.

FIG. 1 shows an illustrative test system 100. A device-under-test (DUT) 102 is electrically coupled to automated test equipment (ATE) 104. The ATE 104 performs electrical tests (or measurements) on the DUT 102. FIG. 1 shows several components for electrically coupling the DUT 102 to the ATE 104. The ATE 104 is electrically coupled to a load-board 106, sometimes referred to as a test board. The load-board 106 may be a printed circuit board. An interposer 108 is electrically coupled to the load-board 106, and a contactor 110 is electrically coupled to the interposer 108 and to the DUT 102. The combination of the load-board 106, the interposer 108, and the contactor 110 electrically couples the DUT 102 to the ATE 104.

Metal contacts are formed on the load-board 106, where one such example is a metal contact 112. Metal contacts are formed on the interposer 108, where one such example is a metal contact 114. The side of the interposer 108 in which the metal contact 114 is formed may be referred to as the load-board side of the interposer 108. The metal contacts on the load-board side of the interposer 108 are electrically coupled to metal contacts on the other side of the interposer 108, where one such example is a metal contact 116. The side of the interposer 108 in which the metal contact 116 is formed may be referred to as the contactor side of the interposer 108. Vias, not shown in FIG. 1, electrically couple the metal contacts on the load-board side to corresponding metal contacts on the contactor side.

Pins within the contactor 110 electrically couple the metal contacts on the contactor side of the interposer 108 to metal contacts on the DUT 102. For example, a pin 118 and a pin 120 each electrically couple the metal contact 116 on the contactor side of the interposer 108 to a metal contact 122 on the DUT 102.

In the particular embodiment illustrated in FIG. 1, a pair of pins in the contactor 110 electrically couples each metal contact on the contactor side of the interposer 108 to a corresponding metal contact on the DUT 102. Some embodiments may utilize one or more than two pins contacting each metal contact on the contactor side of the interposer 108 to a corresponding metal contact on the DUT 102.

For some embodiments, each pin in the contactor 110 may include one or more springs inside one or more concentric and movable shafts so that each pin may be compressed in length to help facilitate good electrical contact with corresponding metal contacts on the interposer 108 and the DUT 102. Such pins are sometimes referred to as pogo pins.

The DUT 102 may comprise a quad flat no-leads (QFN) package, but embodiments are not limited to this type of integrated circuit package. The components illustrated in FIG. 1 are not drawn to scale for ease of illustration.

Figure 2:
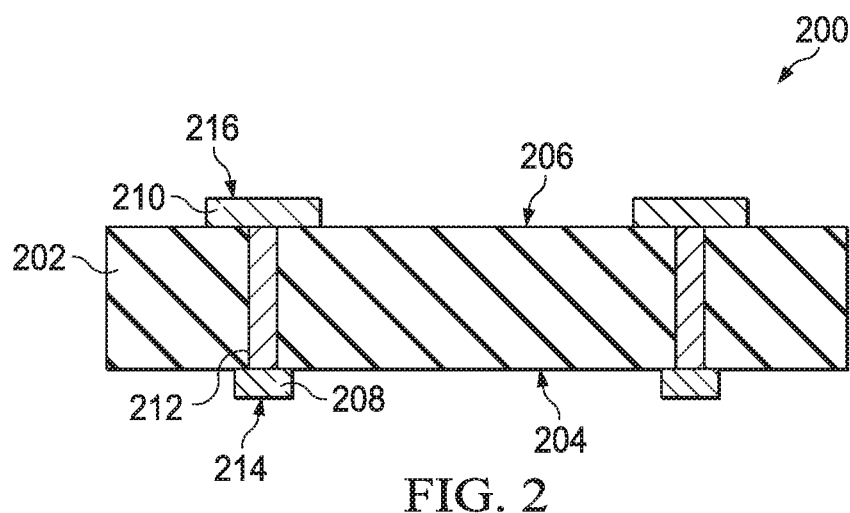
FIG. 2 shows an illustrative interposer in accordance with various examples.

FIG. 2 shows an illustrative interposer 200. The illustrative interposer 200 includes an insulating substrate 202 having a load-board side 204 and a contactor side 206. The insulating substrate 202 may comprise a glass epoxy composite in one or more layers. For example, insulating substrate 202 may comprise a thin FR5 material.

A first plurality of metal contacts is formed on the load-board side 204, where FIG. 2 shows only two metal contacts on the load-board side 204, for example a metal contact 208. A second plurality of metal contacts is formed on the contactor side 206, where FIG. 2 shows only two metal contacts on the contactor side 206, for example a metal contact 210. A plurality of vias is formed in the interposer 200 to electrically couple metal contacts on the load-board side 204 to corresponding metal contacts on the contactor side 206, where for example a via 212 electrically couples the metal contact 208 to the metal contact 210.

The plurality of metal contacts on the load-board side 204, the plurality of metal contacts on the contactor side 206, and the plurality of vias, are in one-to-one correspondence with each other, such that for each metal contact in the plurality of metal contacts on the load-board side 204, there is a corresponding via providing electrical coupling to a corresponding metal contact on the contactor side 206.

Each metal contact in the plurality of metal contacts on the load-board side 204 has a smaller face than the face of each metal contact in the plurality of metal contacts on the contactor side 206. For example, a face 214 of the metal contact 208 is smaller in area than a face 216 of the corresponding metal contact 210 to which the metal contact 208 is electrically coupled by way of the via 212. Furthermore, each metal contact in the plurality of metal contacts on the load-board side 204 is directly under a corresponding metal contact in the plurality of metal contacts on the contactor side 206.

With each metal contact on the load-board side 204 positioned directly under its corresponding metal contact on the contactor side 206, where the face of a metal contact on the load-board side 204 is smaller in area than that of its corresponding metal contact on the contactor side 206, embodiments may utilize a pair (or more) of pins in the contactor 110 for each metal contact on the contactor side 206, without requiring larger metal contacts on the load-board 106. By utilizing two or more pins as opposed to a single pin for each metal contact on the contactor side 206, there is a higher probability of successful electrical coupling from the load-board 106 to the DUT 102.

The components illustrated in FIG. 2 are not drawn to scale, although the perspective of the illustration may be considered similar to a cross-sectional view of the illustrative interposer 200.

Cuts can be made through the insulating substrate 202 such that each metal contact on the load-board side 204 and its corresponding metal contact on the contactor side 206 can have vertical movement relative to the bulk of the insulating substrate 202. This flexibility of movement helps to facilitate good electrical contact from the load-board 106 to the DUT 102.

FIG. 3 shows an illustrative interposer 300 from a perspective looking down into the contactor side 206. FIG. 3 illustrates various cuts through the insulating substrate 202, such as for example a cut 302 between a metal contact 304 and a metal contact 306. The cut 302 is made parallel to the sides of its surrounding metal contacts. For example, the cut 302 is parallel to a side 308 of the metal contact 304. A cut 310 is another example of a cut through the insulating substrate 202, where the cut 310 is perpendicular to the cut 302 and is made parallel to the sides of its surrounding metal contacts. For example, the cut 310 is parallel to a side 312 of a metal contact 314.

As another example, a cut 316 is made between a metal contact 318 and a metal contact 320, and the cut 322 is perpendicular to the cut 316. The cuts may be considered as being grouped into sets of contiguous cuts. For example, the cut 302 is contiguous to the cut 310. Similarly, a cut 324 and a cut 326 are also contiguous to the cuts 302 and 310, so that the cuts 302, 310, 324, and 326 belong to a set of contiguous cuts. Two cuts are contiguous if they meet or intersect.

An industrial laser can be used to make the cuts. A cut described as a single cut in the illustration of FIG. 3 may be manufactured by utilizing one or more passes of an industrial laser to perform the cut. For example, it is immaterial to the description of the embodiments as to whether the cut 324 may be considered as comprising a first cut on one side of the cut 310 and a second cut on the other side of the cut 310.

The relatively large metal contact 328 on the insulating substrate 202 is electrically coupled to a corresponding metal contact on the DUT 102 that provides thermal coupling and ground coupling. Accordingly, because of its relative size, good electrical contact to the metal contact 328 may be accomplished without necessarily having nearby cuts for flexibility of movement.

The components illustrated in FIG. 3 are not drawn to scale. In the particular example of FIG. 3, the interposer 300 is suitable for testing three integrated circuit packages (i.e., 3DUTs). Furthermore, FIG. 3 illustrates each row of metal contacts as having only four metal contacts, but in practice there may be many more than four metal contacts in any one row of metal contacts.

FIG. 4 shows the illustrative interposer 300 of FIG. 3 but with a perspective looking down into the load-board side 204. The metal contacts shown on the load-board side 204 have a smaller face than that of their corresponding metal contacts on the contactor side 206. The cuts shown in FIG. 3 are also shown in FIG. 4 with the same corresponding labels.

As discussed previously, because the metal contacts on the load-board side 204 have a smaller face than their corresponding metal contacts on the contactor side 206, the various cuts through the insulating substrate 202 partition the metal contacts into pairs of metal contacts, where each pair of metal contacts can have vertical movement with respect to the insulating substrate 202. For example, a metal contact 404 as shown in FIG. 4 has as its corresponding metal contact the metal contact 304 shown in FIG. 3. Similarly, the metal contact 406 of FIG. 4 has as its corresponding metal contact the metal contact 306 of FIG. 3. The pair of corresponding metal contacts 404 and 304 move as a pair so that they may adjust to height mismatches on the load-board 106, contactor 110, the DUT 102, and other ATE components. Similarly, the pair of corresponding metal contacts 406 and 306 move as a pair so that they may adjust to height mismatches on the load-board 106.

In some embodiments, a saw may be used to form the cuts in the insulating substrate 202. Furthermore, because a drill bit performs a cutting action, multiple holes may be drilled into the insulating substrate 202 to form one or more cuts. In some embodiments, a cut may be a trench cut.

Figure 7:
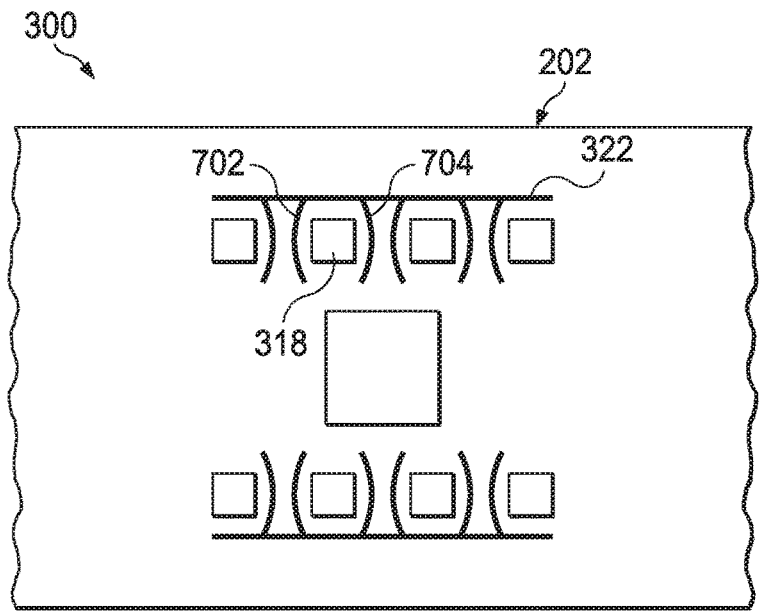
FIG. 7 shows an illustrative interposer from a perspective looking down into the load-board side in accordance with various examples.

In some embodiments, one or more cuts need not be straight (linear). For example, FIG. 7 shows a portion of the illustrative interposer of FIG. 3, but where the cut 316 in FIG. 3 is shown straight, a cut 702 and a cut 704 in FIG. 4 are each curved.

Figure 5:
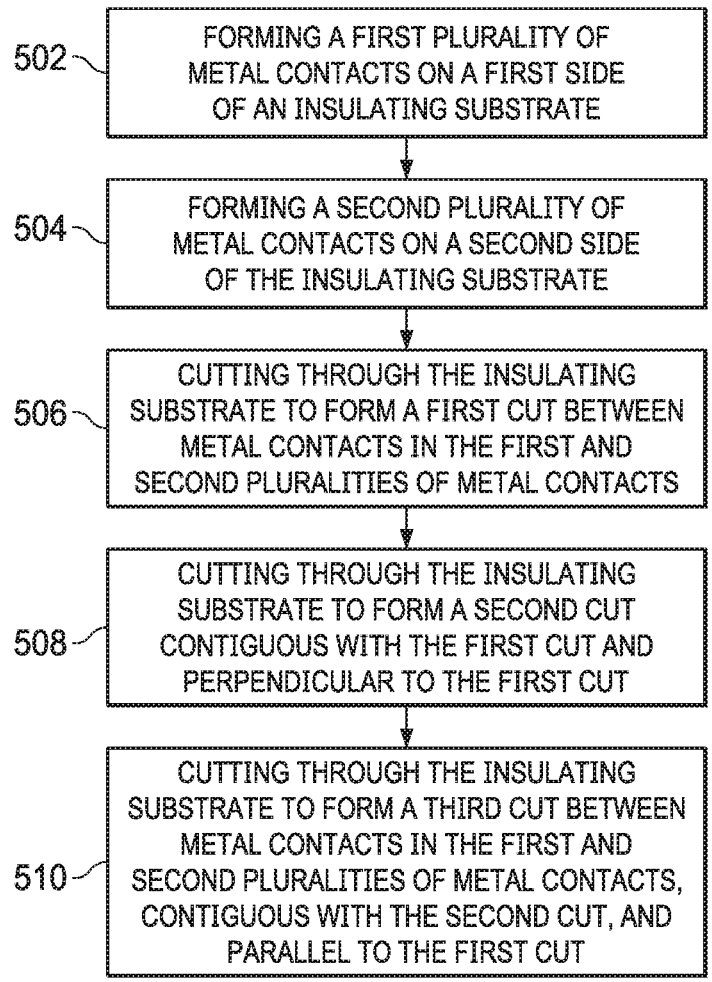
FIG. 5 shows an illustrative method to manufacture an interposer in accordance with various examples.

FIG. 5 shows a method for fabricating an interposer. In step 502, a first plurality of metal contacts is formed on a first side of an insulating substrate. In step 504, a second plurality of metal contacts is formed on a second side of the insulating substrate. These metal contacts may be formed as in conventional interposers, and need not be described in detail. In steps 506, 508, and 510, cuts are made through the insulating substrate. In step 506, a first cut is made through the insulating substrate between metal contacts in the first and second pluralities of metal contacts. In step 508, a second cut is made through the insulating substrate, with the second cut contiguous with the first cut and perpendicular to the first cut, but in some embodiments the second cut is not perpendicular to the first cut. In step 510, a third cut is made through the insulating substrate between metal contacts in the first and second pluralities of metal contacts. The third cut is parallel to the first cut and contiguous with the second cut, but in some embodiments the third cut is not parallel to the first cut. For example, the first and third cuts may be curved. In general, more cuts are made than the three described in FIG. 5.

Figure 6:
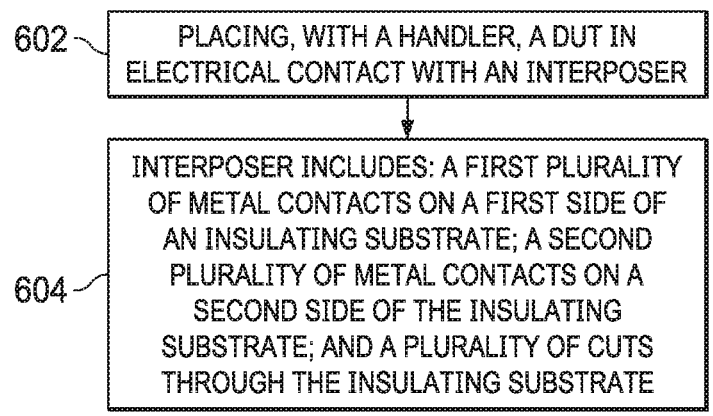
FIG. 6 shows an illustrative method used in manufacturing a device-under-test.

FIG. 6 shows an illustrative method as part of a fabrication process for a DUT. In step 602, using a handler, a DUT is placed in electrical contact with an interposer. For example, referring to FIG. 1, the DUT 102 is in electrical contact with the interposer 108 by way of the pins inside the contactor 110. Step 604 illustrates that the interposer includes an insulating substrate having a first side and a second side, with a first plurality of metal contacts on the first side of the insulating substrate, a second plurality of metal contacts on the second side of the insulating substrate; and a plurality of cuts through the insulating substrate.

Figure 8:
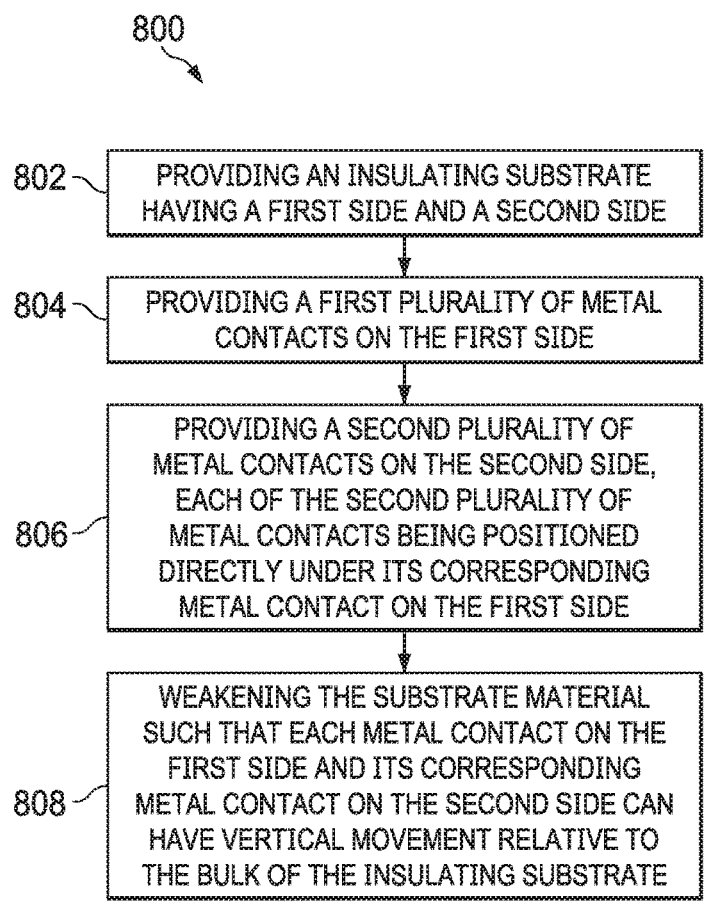
FIG. 8 shows an illustrative method of making an interposer in accordance with various examples.

FIG. 8 shows an illustrative method 800 of making an interposer. Step 802 includes providing an insulating substrate having a first side and a second side. Step 804 includes providing a first plurality of metal contacts on the first side. Step 806 includes providing a second plurality of metal contacts on the second side, each of the second plurality of metal contacts being positioned directly under its corresponding metal contact on the first side. Step 808 includes weakening the substrate material such that each metal contact on the first side and its corresponding metal contact on the second side can have vertical movement relative to the bulk of the insulating substrate.

As described with respect to previous drawings, the plurality of cuts in step 604 includes a first cut between a first metal contact in the first plurality of metal contacts and a second metal contact in the first plurality of metal contacts, and where the first cut is between a first metal contact in the second plurality of metal contacts and a second metal contact in the second plurality of metal contacts. The plurality of cuts comprises a second cut perpendicular to and contiguous with the first cut, and a third cut parallel to the first cut and contiguous with the second cut. For some embodiments, the third cut is between a third metal contact in the first plurality of metal contacts and a fourth metal contact in the first plurality of metal contacts, and between a third metal contact in the second plurality of metal contacts and a fourth metal contact in the second plurality of metal contacts. For some embodiments, the third cut is between the second metal contact in the first plurality of metal contacts and a third metal contact in the first plurality of metal contacts, and between the second metal contact in the second plurality of metal contacts and a third metal contact in the second plurality of metal contacts.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising an interposer, the interposer comprising:
    an insulating substrate having a first side and a second side;
    a first plurality of metal contacts on the first side;
    a second plurality of metal contacts on the second side; and
    a plurality of cuts through the insulating substrate, the plurality of cuts comprising
        a first cut between a first metal contact in the first plurality of metal contacts and a second metal contact in the first plurality of metal contacts, between a first metal contact in the second plurality of metal contacts and a second metal contact in the second plurality of metal contacts, and parallel to a first side of the second metal contact;
        a second cut perpendicular to the first cut, contiguous with the first cut, and parallel to a second side of the second metal contact; and
        a third cut between the second metal contact in the first plurality of metal contacts and a third metal contact in the first plurality of metal contacts, between the second metal contact in the second plurality of metal contacts and a third metal contact in the second plurality of metal contacts, and parallel to the first cut.

2. The system of claim 1, further comprising:
    a load-board having a plurality of metal contacts in contact with the second plurality of metal contacts; and a contactor having pins in contact with the first plurality of metal contacts, wherein for each metal contact in the first plurality of metal contacts, two or more pins in the contactor are in contact with the each metal contact.

3. The system of claim 1 wherein the third cut is contiguous with the second cut.

4. The system of claim 3, wherein the third cut is between a third metal contact in the first plurality of metal contacts and a fourth metal contact in the first plurality of metal contacts, and between a third metal contact in the second plurality of metal contacts and a fourth metal contact in the second plurality of metal contacts.

5. The system of claim 4, wherein the third cut is between the second metal contact in the first plurality of metal contacts and a third metal contact in the first plurality of metal contacts, and between the second metal contact in the second plurality of metal contacts and a third metal contact in the second plurality of metal contacts.

6. The system of claim 1, wherein no two metal contacts in the first plurality of metal contacts are electrically connected to each other, and no two metal contacts in the second plurality of metal contacts are electrically connected to each other.

7. The system of claim 1, wherein the first plurality of metal contacts is in one-to-one correspondence with the second plurality of metal contacts.

8. The system of claim 7, further comprising a plurality of vias in one-to-one correspondence with the first plurality of metal contacts, wherein each via in the plurality of vias electrically connects a corresponding metal contact in the first plurality of metal contacts with a corresponding metal contact in the second plurality of metal contacts.

9. The system of claim 7, wherein each metal contact in the second plurality of metal contacts has a smaller face than that of each metal contact in the first plurality of metal contacts.

10. The system of claim 9, wherein each metal contact in the second plurality of metal contacts is directly under a corresponding metal contact in the first plurality of metal contacts.

11. The system of claim 1, wherein the insulating substrate comprises an FR5 material.

12. The system of claim 1, wherein the insulating substrate comprises a glass epoxy composite.

13. The system of claim 1, wherein the insulating substrate comprises a plurality of layers, each layer comprising a glass epoxy composite.

14. An apparatus for testing packaged integrated circuits, comprising:
  an interposer, comprising:
    an insulating substrate having a first side and a second side;
    a first plurality of metal contacts on the first side;
    a second plurality of metal contacts on the second side; and
    a plurality of cuts through the insulating substrate, the plurality of cuts comprising a first cut between a first metal contact in the first plurality of metal contacts and a second metal contact in the first plurality of metal contacts, and between a first metal contact in the second plurality of metal contacts and a second metal contact in the second plurality of metal contacts;
  a load-board having a plurality of metal contacts in contact with the second plurality of metal contacts; and
  a contactor having pins in contact with the first plurality of metal contacts, wherein for each metal contact in the first plurality of metal contacts, two or more pins in the contactor are in contact with the each metal contact.

15. The apparatus of claim 14, further including an automatic test equipment coupled to the load-board.

* * * * *